US012610673B2

(12) United States Patent
Richter

(10) Patent No.: US 12,610,673 B2
(45) Date of Patent: Apr. 21, 2026

(54) RADIATION-EMITTING COMPONENT, METHOD FOR PRODUCING A RADIATION-EMITTING COMPONENT, AND MODULE WITH A RADIATION-EMITTING COMPONENT

(71) Applicant: ams-OSRAM International GmbH, Regensburg (DE)

(72) Inventor: Daniel Richter, Bad Abbach (DE)

(73) Assignee: ams_OSRAM International GmbH, Regensburg (DE)

( * ) Notice: Subject to any disclaimer, the term of this patent is extended or adjusted under 35 U.S.C. 154(b) by 758 days.

(21) Appl. No.: 18/015,922

(22) PCT Filed: Jul. 21, 2021

(86) PCT No.: PCT/EP2021/070385
§ 371 (c)(1),
(2) Date: Jan. 12, 2023

(87) PCT Pub. No.: WO2022/028893
PCT Pub. Date: Feb. 10, 2022

(65) Prior Publication Data
US 2023/0290917 A1 Sep. 14, 2023

(30) Foreign Application Priority Data
Aug. 4, 2020 (DE) ..................... 10 2020 120 502.3

(51) Int. Cl.
*H10H 20/857* (2025.01)
*H10H 20/01* (2025.01)
(Continued)

(52) U.S. Cl.
CPC ...... *H10H 20/857* (2025.01); *H10H 20/0137* (2025.01); *H10H 20/852* (2025.01);
(Continued)

(58) Field of Classification Search
CPC ............. H10H 20/0137; H10H 20/852; H10H 20/0362; H10H 20/0364; H10H 20/857;
(Continued)

(56) References Cited

U.S. PATENT DOCUMENTS 12,027,503 B2* 7/2024 Pfeuffer ............. H10H 20/8506
2006/0108669 A1* 5/2006 Matsumoto .......... H10H 20/856
257/E33.072

(Continued)

FOREIGN PATENT DOCUMENTS

DE 102014116133 A1 5/2016
DE 102015104185 A1 9/2016
(Continued)

OTHER PUBLICATIONS

International Search Report and Written Opinion issued in International Patent Application No. PCT/EP2021/070385 on Nov. 9, 2021.

*Primary Examiner* — Victor A Mandala
(74) *Attorney, Agent, or Firm* — ArentFox Schiff LLP

(57) ABSTRACT

The invention relates to a radiation-emitting component, comprising: a radiation-emitting semiconductor chip, which during operation emits electromagnetic radiation from a radiation-emitting main face and has two electrical contacts, which are arranged on a main face of the radiation-emitting semiconductor chip opposite the radiation-emitting main face, a lead frame with two electrical connection points, each of which has a mounting face, wherein at least one mounting face is delimited by a wall each electrical contact of the radiation-emitting semiconductor chip is applied to a mounting face, and the radiation-emitting semiconductor chip protrudes beyond the wall. Additionally described are a method for producing a radiation-emitting component and a module comprising a radiation-emitting component.

19 Claims, 10 Drawing Sheets

(51) Int. Cl.
  *H10H 20/852* (2025.01)
  *H10W 90/00* (2026.01)
(52) U.S. Cl.
  CPC ........ *H10W 90/00* (2026.01); *H10H 20/0362*
      (2025.01); *H10H 20/0364* (2025.01)
(58) Field of Classification Search
  CPC .. H10H 20/013; H10H 20/137; H01L 25/167;
          H01L 25/0753; H10W 90/00
  See application file for complete search history.

(56) References Cited

U.S. PATENT DOCUMENTS

| | | | | |
|---|---|---|---|---|
| 2008/0128724 A1* | 6/2008 | Isobe | H10H 20/857 | |
| | | | 257/E33.072 | |
| 2009/0321778 A1 | 12/2009 | Chen et al. | | |
| 2010/0301738 A1* | 12/2010 | Hosokawa | C04B 35/22 | |
| | | | 313/503 | |
| 2011/0175127 A1* | 7/2011 | Kanada | H10H 20/856 | |
| | | | 257/E33.059 | |
| 2012/0012880 A1* | 1/2012 | Lee | H10H 20/8582 | |
| | | | 257/98 | |
| 2013/0010226 A1* | 1/2013 | Chang | H10H 20/8506 | |
| | | | 257/E33.072 | |
| 2013/0015490 A1* | 1/2013 | Lin | H10H 20/8506 | |
| | | | 257/E33.059 | |
| 2013/0056780 A1* | 3/2013 | Kono | H10H 20/856 | |
| | | | 257/E33.072 | |
| 2015/0194572 A1* | 7/2015 | Kwon | H10H 20/819 | |
| | | | 257/98 | |
| 2015/0270459 A1* | 9/2015 | Dirscherl | H10H 20/854 | |
| | | | 257/98 | |
| 2016/0064604 A1* | 3/2016 | Lin | H10H 20/857 | |
| | | | 257/98 | |
| 2016/0190413 A1* | 6/2016 | Abe | H10H 20/857 | |
| | | | 257/676 | |
| 2016/0351767 A1* | 12/2016 | Choi | H10H 20/857 | |
| 2017/0244012 A1 | 8/2017 | Choi et al. | | |
| 2018/0287005 A1* | 10/2018 | Camargo | H10F 55/00 | |
| 2019/0157531 A1* | 5/2019 | Moon | H10H 20/857 | |
| 2020/0287111 A1* | 9/2020 | Schwarz | H10H 20/857 | |
| 2021/0043818 A1* | 2/2021 | Miyazaki | H10H 20/857 | |
| 2022/0263001 A1* | 8/2022 | Arndt | H10H 20/856 | |

FOREIGN PATENT DOCUMENTS

| | | | | |
|---|---|---|---|---|
| EP | 2642535 A2 | 9/2013 | | |
| EP | 3211670 A1 | 8/2017 | | |
| JP | 2016018990 A | 2/2016 | | |
| WO | 2015036231 A1 | 3/2015 | | |
| WO | 2018059697 A1 | 4/2018 | | |
| WO | WO 2018/059697 | * | 4/2018 | 33/48 |

* cited by examiner

FIG 9
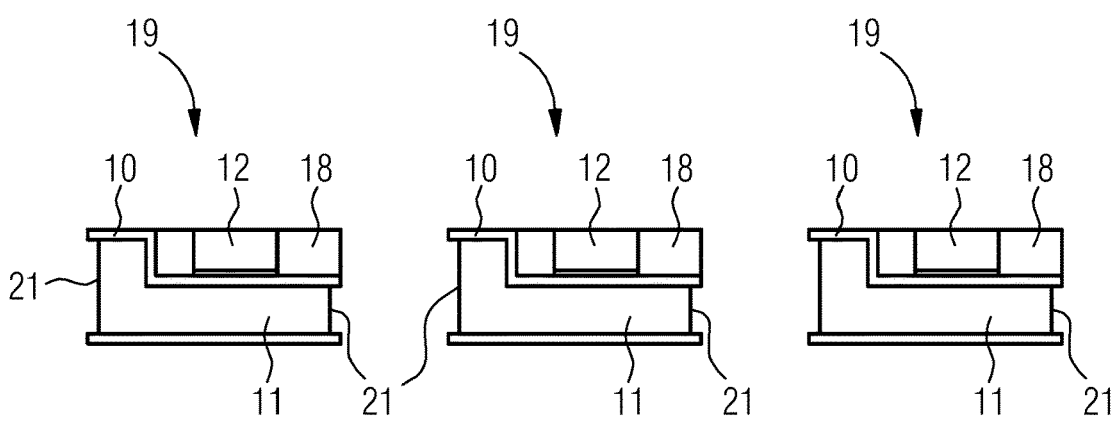
FIG 10
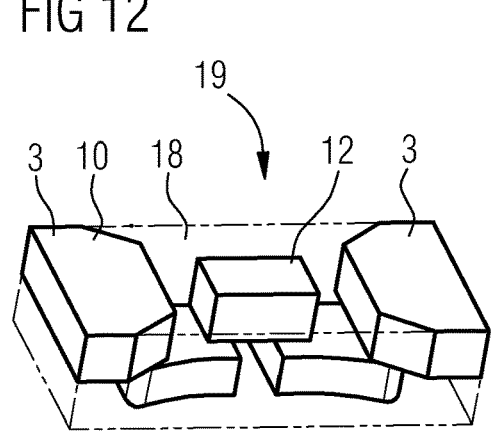
FIG 11
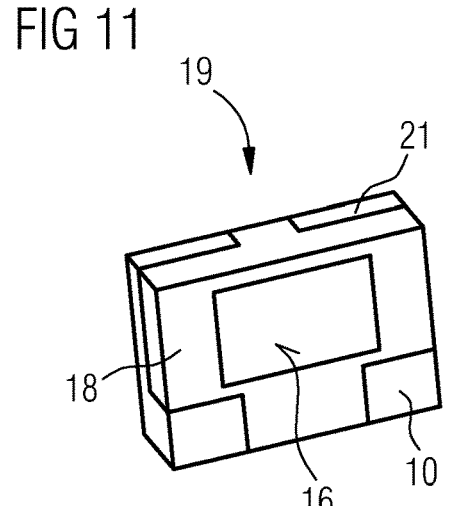
FIG 12
FIG 13
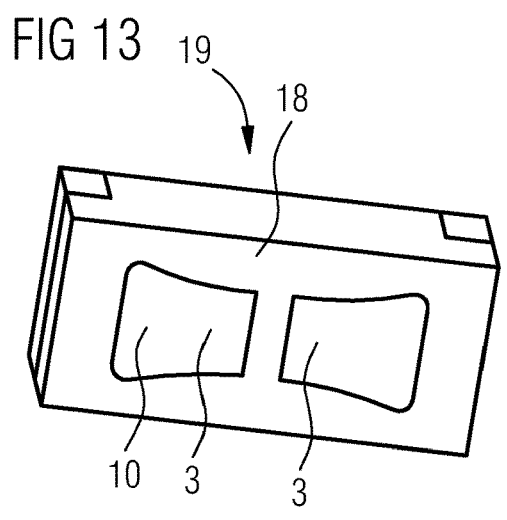

FIG 36
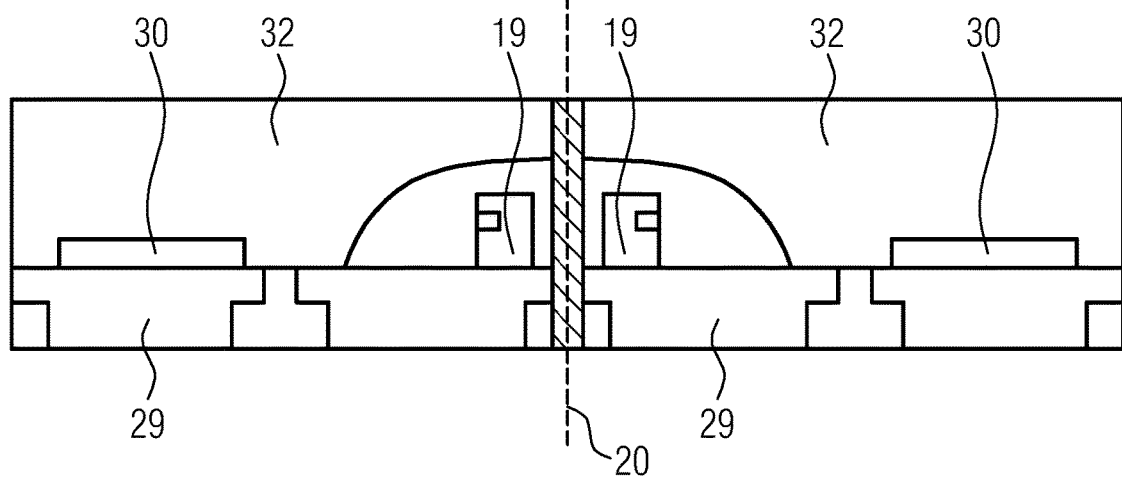
FIG 37
FIG 38
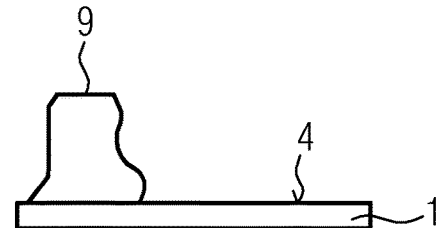
FIG 39
FIG 40
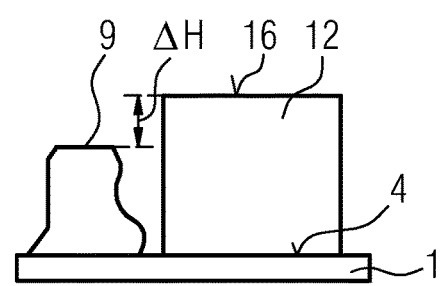
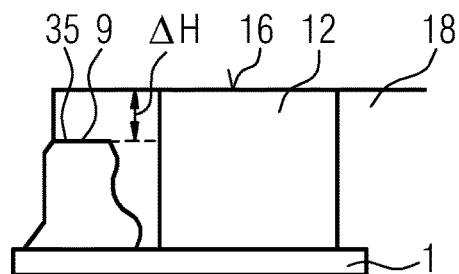

RADIATION-EMITTING COMPONENT, METHOD FOR PRODUCING A RADIATION-EMITTING COMPONENT, AND MODULE WITH A RADIATION-EMITTING COMPONENT

CROSS-REFERENCE TO RELATED APPLICATIONS

This application is a 35 U.S.C. § 371 National Phase of PCT Application No. PCT/EP2021/070385, filed Jul. 21, 2021, which claims priority to German Application No. 10 2020 120 502.3, filed Aug. 4, 2020, the disclosures of each of which are incorporated herein by reference in their entirety.

A radiation-emitting component, a method for producing a radiation-emitting component, and a module comprising a radiation-emitting component are specified.

Radiation-emitting components are specified in the document DE 102020112389, for example.

A radiation-emitting component with a compact design is intended to be specified. Furthermore, a method for producing said radiation-emitting component and a module comprising such a radiation-emitting component are intended to be provided.

These objects are achieved by means of a radiation-emitting component having the features of patent claim 1, by means of a method having the steps of patent claim 9, and by means of a module having the features of patent claim 15.

Advantageous embodiments and developments of the radiation-emitting component, of the method for producing said radiation-emitting component, and of the module are specified in the respective dependent claims.

In accordance with one embodiment, the radiation-emitting component comprises a radiation-emitting semiconductor chip, which during operation emits electromagnetic radiation from a radiation-emitting main surface. Furthermore, the radiation-emitting semiconductor chip preferably comprises two electrical contacts arranged at a main surface of the radiation-emitting semiconductor chip situated opposite the radiation-emitting main surface.

The radiation-emitting semiconductor chip generally comprises an epitaxially grown semiconductor layer sequence having an active zone, which is configured and provided for generating the electromagnetic radiation. The epitaxial semiconductor layer sequence having the active zone is generally applied on a substrate. The substrate can be a growth substrate for the epitaxial semiconductor layer sequence or else a carrier that is different than the growth substrate.

By way of example, the epitaxial semiconductor layer sequence is based on a nitride compound semiconductor material or consists of a nitride compound semiconductor material. Nitride compound semiconductor materials are compound semiconductor materials which contain nitrogen, such as the materials from the system $In_xAl_yGa_{1-x-y}N$ where $0 \le x \le 1$, $0 \le y \le 1$ and $x+y \le 1$.

An epitaxial semiconductor layer sequence which is based on a nitride compound semiconductor material or consists of a nitride compound semiconductor material is grown epitaxially for example on a growth substrate comprising sapphire or consisting of sapphire. Alternatively, silicon carbide is also suitable as material for a growth substrate for an epitaxial semiconductor layer sequence which is based on a nitride compound semiconductor material or consists of a nitride compound semiconductor material. Sapphire and silicon carbide are transmissive to ultraviolet to blue light.

Therefore, such a radiation-emitting semiconductor chip emits the light generated in the active zone generally not only from the radiation-emitting main surface but also from side surfaces arranged between the radiation-emitting main surface and the main surface situated opposite the radiation-emitting main surface.

An epitaxial semiconductor layer sequence which is based on a nitride compound semiconductor material or consists thereof generally has an active zone that generates electromagnetic radiation from the ultraviolet to blue visible spectral range during operation of the radiation-emitting semiconductor chip.

A radiation-emitting semiconductor chip in which the electrical contacts are arranged on a main surface situated opposite the radiation-emitting main surface is also referred to as a flip-chip.

Furthermore, it is also possible for the epitaxial semiconductor layer sequence to be based on an arsenide compound semiconductor material or to consist of an arsenide compound semiconductor material. Arsenide compound semiconductor materials are compound semiconductor materials which contain arsenic, such as the materials from the system $In_xAl_yGa_{1-x-y}As$ where $0 \le x \le 1$, $0 \le y \le 1$ and $x+y \le 1$.

Finally, the epitaxial semiconductor layer sequence can be based on a phosphide compound semiconductor material or consist of a phosphide compound semiconductor material. Phosphide compound semiconductor materials are compound semiconductor materials which contain phosphorus, such as the materials from the system $In_xAl_yGa_{1-x-y}P$ where $0 \le x \le 1$, $0 \le y \le 1$ and $x+y \le 1$.

In accordance with a further embodiment, the radiation-emitting component comprises a leadframe comprising two electrical connection points, each of which has a mounting surface. Each mounting surface of the electrical connection points of the leadframe is configured and provided for being mechanically stably and electrically conductively connected to an electrical contact of the radiation-emitting semiconductor chip, for example by means of soldering or adhesive bonding using an electrically conductive adhesive. The mounting surface is particularly preferably embodied such that it is solderable.

In accordance with one embodiment of the radiation-emitting component, the leadframe comprises a metallic core and a metallic coating, wherein the metallic core is formed from a different material than the metallic coating. By way of example, the metallic core comprises a copper alloy or is formed from a copper alloy. The metallic coating is deposited on the metallic core of the leadframe by means of an electrolytic method, for example. By way of example, the metallic coating comprises one or more of the following materials: nickel, platinum, gold, silver. In particular, the metallic coating is preferably embodied such that it is solderable. Preferably, the mounting surface has the metallic coating.

In accordance with a further embodiment of the radiation-emitting component, at least one mounting surface is delimited by a wall. The wall is particularly preferably part of the leadframe and formed from the material thereof. In other words, the wall is preferably an integral constituent part of the leadframe. The mounting surface, too, is preferably an integral constituent part of the leadframe. Particularly preferably, each electrical connection point of the leadframe has a mounting surface delimited by a wall.

The wall particularly preferably runs along a side surface of the radiation-emitting semiconductor chip which runs between the main surface of the radiation-emitting semiconductor chip at which the contacts are arranged and the opposite main surface. By way of example, the wall runs parallel to the side surface of the radiation-emitting semiconductor chip.

In accordance with a further embodiment of the radiation-emitting component, the wall projects beyond the mounting surface. In other words, the mounting surface is recessed relative to a surface of the wall in order to receive the radiation-emitting semiconductor chip.

By way of example, a sectional view through the wall and the mounting surface is embodied in L-shaped fashion. By way of example, the wall runs perpendicular to the mounting surface.

In accordance with a further embodiment of the radiation-emitting component, each electrical contact of the radiation-emitting semiconductor chip is applied to a mounting surface of an electrical connection point of the leadframe. Preferably, each electrical contact of the radiation-emitting semiconductor chip is electrically conductively and mechanically stably connected to a mounting surface of the leadframe.

In accordance with a further particularly preferred embodiment of the radiation-emitting component, the wall terminates flush with the radiation-emitting main surface of the radiation-emitting semiconductor chip.

In accordance with a further embodiment of the radiation-emitting component, the radiation-emitting semiconductor chip projects beyond the wall. In other words, a surface of the wall and the radiation-emitting main surface of the radiation-emitting semiconductor chip lie in two different planes, such that there is a height difference between the surface of the wall and the radiation-emitting main surface of the radiation-emitting semiconductor chip. The height difference can be compensated for by a potting.

In accordance with a further embodiment of the radiation-emitting component, both mounting surfaces are each delimited by a wall, wherein either each wall terminates flush with the radiation-emitting main surface of the radiation-emitting semiconductor chip or the radiation-emitting semiconductor chip projects beyond each wall. In other words, the leadframe has two electrical connection points, each of which has a mounting surface delimited in each case by a wall. By way of example, the two electrical connection points are arranged and embodied mirror-symmetrically with respect to one another.

In accordance with a further embodiment of the radiation-emitting component, the radiation-emitting semiconductor chip is embedded in a potting, such that only the radiation-emitting main surface is exposed. Preferably, the radiation-emitting main surface terminates flush with the potting. If there is a height difference between the surface of the wall and the radiation-emitting main surface of the radiation-emitting semiconductor chip, then the potting preferably compensates for the height difference.

Preferably, the potting is embodied such that it is transparent to the radiation of the radiation-emitting semiconductor chip. In this case, "transparent" means that the potting transmits at least 85%, preferably at least 90% and particularly preferably at least 95% of the electromagnetic radiation of the radiation-emitting semiconductor chip. By way of example, the potting is formed from a silicone or an epoxy or a mixture of these two materials or comprises one of these materials.

In accordance with a further embodiment, the radiation-emitting component comprises a plurality of leadframes. Preferably, the leadframes are identically embodied and/or connected to one another. Preferably, a respective radiation-emitting semiconductor chip is applied to each leadframe. In accordance with one embodiment, the radiation-emitting semiconductor chips emit light of different colors during operation. By way of example, one of the radiation-emitting semiconductor chips emits blue light during operation, a further radiation-emitting semiconductor chip emits green light during operation, and yet another radiation-emitting semiconductor chip emits red light during operation.

Particularly preferably, the radiation-emitting component is free of a premolded package. In this case, the mechanical stabilization of the component takes place at least partly over the leadframe. The potting, too, contributes to the mechanical stabilization. In this case, it is advantageous in particular that the wall terminates flush with the radiation-emitting main surface of the radiation-emitting semiconductor chip or the semiconductor chip projects beyond the wall, since the radiation-emitting semiconductor chip is thus protected and mechanically stabilized. A very compact radiation-emitting component, in particular, can be attained in this way.

In accordance with a further embodiment, outer surfaces of the radiation-emitting component are formed by the potting and the leadframe.

The radiation-emitting component described here can be produced by the method described below. All features and configurations described in association with the radiation-emitting component can also be embodied in the case of the method, and vice versa.

In accordance with one embodiment of the method, a leadframe comprising two electrical connection points is provided. Each electrical connection point has a mounting surface, wherein at least one mounting surface is delimited by a wall.

In accordance with one embodiment of the method, a radiation-emitting semiconductor chip which during operation emits electromagnetic radiation from a radiation-emitting main surface and has two electrical contacts arranged on the main surface of the radiation-emitting semiconductor chip situated opposite the radiation-emitting main surface is applied to the leadframe, such that each electrical contact of the semiconductor chip is applied to a mounting surface and the wall terminates flush with the radiation-emitting main surface of the radiation-emitting semiconductor chip or the radiation-emitting semiconductor chip projects beyond the wall.

In accordance with a further embodiment of the method, the leadframe is produced by means of the following steps:

providing a metallic foil, structuring the metallic foil, thereby forming the electrical connection points having the mounting surfaces, wherein a mounting surface is delimited by the wall. By way of example, structuring the metallic foil can be effected by means of one of the following methods: etching, stamping, embossing. In the case of etching, half-etches and multistage etching can be implemented.

In accordance with a further embodiment of the method, a metallic foil is provided and the wall is produced on the metallic foil by applying a polymer material. In this case, the polymer material has comparatively high viscosity.

In accordance with a further embodiment of the method, the radiation-emitting semiconductor chip is embedded in a potting in such a way that the radiation-emitting main surface is freely accessible. Preferably, the radiation-emitting main surface terminates flush with the potting. If there is a height difference between a surface of the wall and the radiation-emitting main surface of the radiation-emitting semiconductor chip, then the potting preferably compensates for the height difference.

Preferably, the radiation-emitting semiconductor chip is embedded in the potting by means of foil assisted molding (FAM for short). By way of example, a height difference of up to +/−20 micrometers can be compensated for by foil assisted molding.

In accordance with a further embodiment of the method, the leadframe is part of a leadframe assemblage comprising a multiplicity of leadframes. The multiplicity of leadframes are connected mechanically stably among one another, for example by means of struts. By way of example, the leadframes of the leadframe assemblage are embodied identically.

In accordance with a further embodiment of the method, radiation-emitting semiconductor chips are applied to the electrical connection points of the leadframes and are mechanically stably and electrically conductively connected to the mounting surfaces of the electrical connection points.

In accordance with a further embodiment of the method, the leadframe, after a multiplicity of radiation-emitting semiconductor chips have been applied to mounting surfaces of the leadframes, is singulated into individual components. The singulation can be effected by means of sawing, for example. During the singulation, material of a metallic core of the leadframes is generally exposed in regions. Particularly preferably, at least the regions in which the material of the metallic core is exposed are provided with a metallic, solderable coating. In this regard, the finished radiation-emitting component can advantageously be connected to a connection carrier by means of soldering to form a module.

The radiation-emitting component described here is suitable in particular for being incorporated in a radiation-emitting module. Features and embodiments disclosed in association with the radiation-emitting component in the present case can also be embodied in the case of the module, and vice versa.

In accordance with one embodiment, the module comprises a radiation-emitting component such as has already been described.

Furthermore, the module preferably comprises a connection carrier, on which the radiation-emitting component is applied. The connection carrier can be a printed circuit board.

Preferably, the radiation-emitting component is applied to the connection carrier by way of a metallic outer surface, for example by means of soldering or adhesive bonding. Preferably, the metallic outer surface is an outer surface of the leadframe.

By way of example, the metallic outer surface is formed from material of the metallic coating.

In accordance with one embodiment of the module, the radiation-emitting main surface of the radiation-emitting component is arranged along a main surface of the connection carrier. In this embodiment of the module, a main emission direction of the radiation-emitting component runs substantially perpendicular to the main surface.

In accordance with a further embodiment of the module, the radiation exit surface of the radiation-emitting component is arranged transversely with respect to a main surface of the connection carrier. In this embodiment of the module, a main emission direction of the radiation-emitting component runs substantially transversely with respect to the main surface (so-called "side-looker" design).

In accordance with a further embodiment, the module comprises an electronic semiconductor chip having an integrated circuit, wherein the electronic semiconductor chip is likewise applied on the connection carrier. The electronic semiconductor chip can be embodied and provided for driving the radiation-emitting semiconductor chip.

In accordance with a further embodiment, the module comprises a further potting, embodied for example as diffusely reflective. The further potting comprises for example a matrix material such as silicone or epoxy or a mixture of these materials. In accordance with one embodiment, diffusely reflective particles, for example titanium dioxide particles, are introduced into the matrix material and impart diffusely reflective properties to the further potting. Alternatively or additionally, light-absorbing particles can also be introduced into the matrix material, such that the potting is embodied as light-absorbing.

By way of example, the light-absorbing particles are carbon black particles.

In accordance with a further embodiment, an outer surface of the module is partly formed by the diffusely reflective potting, such that only a radiation exit surface of the module is exposed.

In accordance with a further embodiment of the module, the radiation-emitting component comprises a semiconductor chip that emits blue light during operation, a further radiation-emitting semiconductor chip, which emits green light during operation, and yet another radiation-emitting semiconductor chip, which emits red light during operation. In this case, the module preferably emits blue light, green light and red light.

Further advantageous embodiments and developments of the radiation-emitting component, of the method for producing said radiation-emitting component, and of the module will become apparent from the exemplary embodiments described below in association with the figures.

The schematic illustrations in FIGS. 1 to 18 show various stages of a method in accordance with one exemplary embodiment.

FIGS. 19 to 27 show schematic illustrations of radiation-emitting components in accordance with various exemplary embodiments.

The schematic illustration in FIG. 28 shows a stage of a method in accordance with a further exemplary embodiment.

With reference to FIG. 36, a module in accordance with one exemplary embodiment and a method for producing same are explained in more specific detail.

The schematic illustrations in FIGS. 37 to 40 show various stages of a method in accordance with a further exemplary embodiment.

Elements that are identical, of identical type or act identically are provided with the same reference signs in the figures. The figures and the size relationships of the elements illustrated in the figures among one another should not be regarded as to scale. Rather, individual elements, in particular layer thicknesses, may be illustrated with an exaggerated size in order to enable better illustration and/or in order to afford a better understanding.

Figure 1:
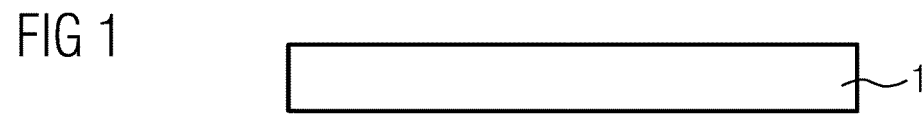

In the case of the method in accordance with the exemplary embodiment in FIGS. 1 to 18, a metallic foil 1 is provided in a first step (FIG. 1). The metallic foil 1 comprises a copper alloy or is formed from a copper alloy.

In a next step, the metallic foil 1 is structured, such that a leadframe assemblage 8 comprising a multiplicity of leadframes 2 is formed. The structuring of the metallic foil 1 to form the leadframe assemblage 8 can be effected by means of etching, for example.

Figure 2:
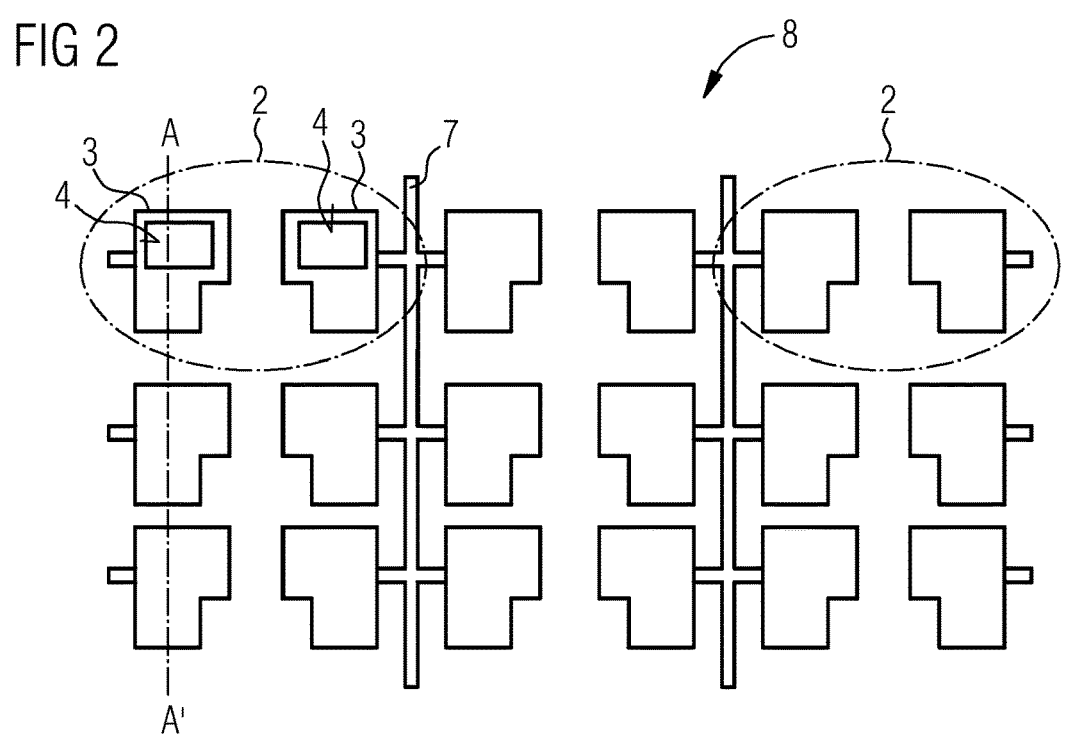

The multiplicity of leadframes 2 are shown in plan view in FIG. 2, for example. Each leadframe 2 comprises two electrical connection points 3 having mounting surfaces 4, which are provided for being mechanically stably and electrically conductively connected to the electrical contacts 5 of a radiation-emitting semiconductor chip 12. The multiplicity of leadframes 2 are connected mechanically stably among one another by means of struts 7.

Figure 3:
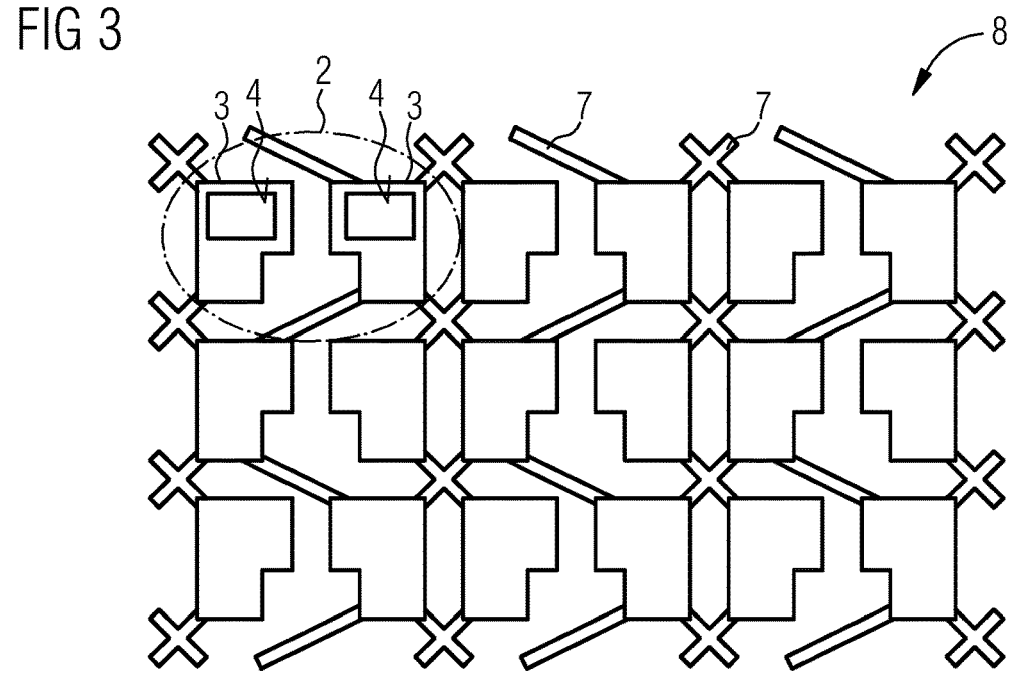

The leadframe assemblage 8 in accordance with FIG. 3 differs from the leadframe assemblage 8 in accordance with FIG. 2 in particular in the arrangement and geometry of the struts 7. In particular, the electrical connection points 3 and the mounting surfaces 4 of the individual leadframes 2 of the leadframe assemblage 8 in FIG. 3 are identical to the electrical connection points 3 and the mounting surfaces 4 of the leadframes 2 in FIG. 2.

Figure 4:
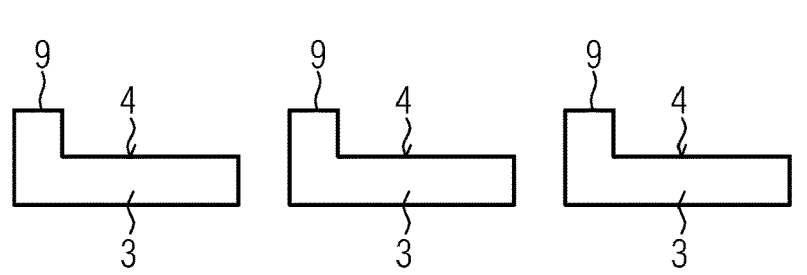

FIG. 4 shows schematic sectional illustrations of the electrical connection points 3 along the line A-A' from FIG. 2. Each electrical connection point 3 comprises a wall 9 alongside the mounting surface 4, said wall delimiting the mounting surface 4. The wall 9 projects laterally beyond the mounting surface 4.

Figure 5:
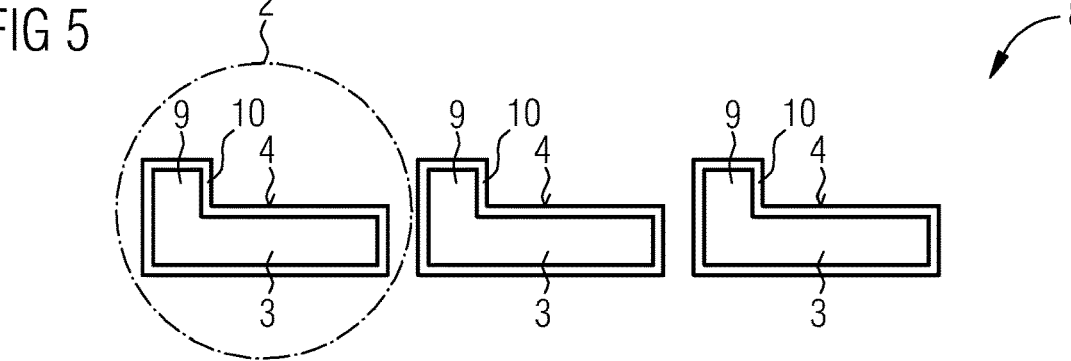

In a next step, a metallic coating 10 is applied to the leadframe assemblage 8 (FIG. 5). The metallic coating 10 is deposited on the leadframe assemblage 8 electrolytically, for example, and comprises one or more of the following materials: nickel, platinum, gold, silver. The metallic coating 10 is particularly preferably embodied such that it is solderable. Preferably, the metallic coating 10 is applied to the leadframe assemblage 8 over the whole area.

In the present case, then, each leadframe 2 is formed from a metallic core 11 and a metallic coating 10. The metallic core 11 here is formed from material of the metallic foil 1, that is to say from a copper alloy, and is completely covered by the metallic coating 10.

Each electrical connection point 3 of the leadframe 2 has a mounting surface 4, then, which in the present case is formed from material of the metallic coating 10.

Figure 6:
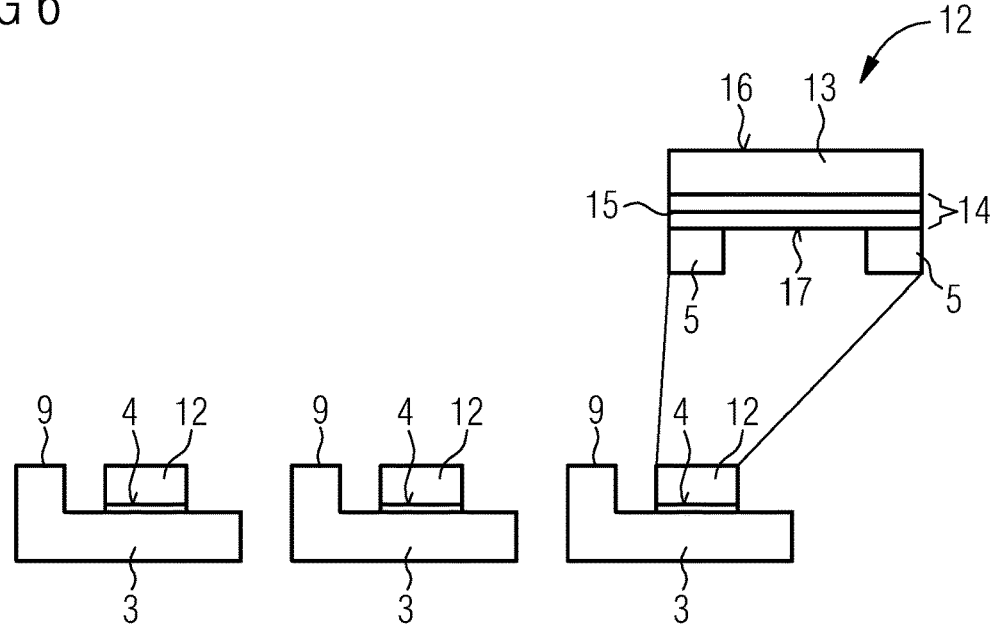

In a next step, a radiation-emitting semiconductor chip 12 is applied to each leadframe 2, for example by means of adhesive bonding or soldering (FIG. 6). Radiation-emitting semiconductor chips 12 that emit light of the same color are used in the present case. The radiation-emitting semiconductor chip 12 is in each case mechanically stably and electrically conductively connected to the leadframe 2. The metallic coating is not illustrated in FIG. 6, for reasons of clarity.

In the present case, the radiation-emitting semiconductor chip 12 comprises a growth substrate 13 and an epitaxial semiconductor layer sequence 14. The epitaxial semiconductor layer sequence 14 comprises an active zone 15 suitable for generating electromagnetic radiation during operation. In the present case, the epitaxial semiconductor layer sequence 14 comprises a nitride compound semiconductor material and the active zone 15 is suitable for generating blue light. The epitaxial semiconductor layer sequence 14 is grown epitaxially on the growth substrate 13. The growth substrate 13 comprises sapphire or silicon carbide or consists of one of these materials. Two electrical contacts for energizing the active zone 15 are arranged at a main surface 17 of the radiation-emitting semiconductor chip 12 situated opposite a radiation-emitting main surface 16. The radiation-emitting main surface 16 is free of electrical contacts 5. The wall 9 of the leadframe 2 terminates flush with the radiation-emitting main surface 16 of the radiation-emitting semiconductor chip 12. Alternatively, it is also possible for the radiation-emitting semiconductor chip 12 to project beyond the wall 9.

Figure 7:
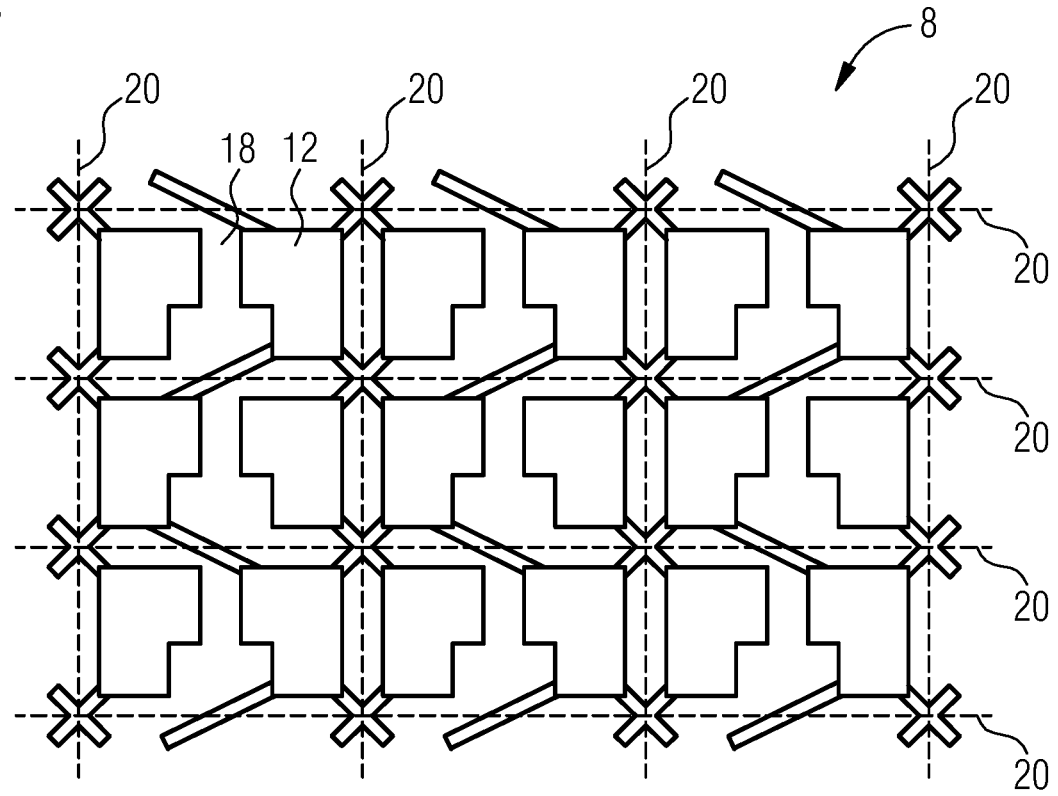

As shown in the plan view in accordance with FIG. 7, a radiation-emitting semiconductor chip 12 is applied to each leadframe 2. The radiation-emitting semiconductor chips 12 are subsequently encapsulated with a potting 18, which is transmissive to the radiation of the radiation-emitting semiconductor chip 12. By way of example, the radiation-transmissive potting 12 is a silicone.

Figure 8:
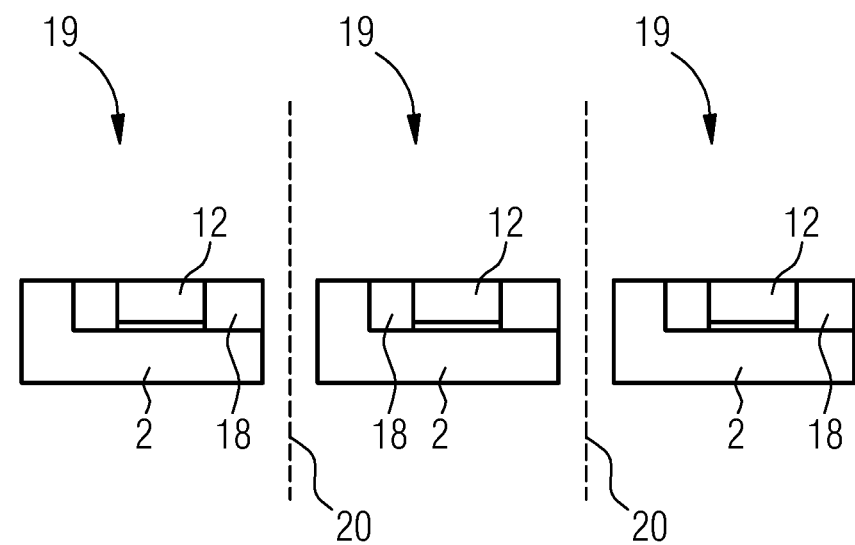

In a next step, illustrated schematically in FIG. 8, the radiation-emitting components 19 are singulated along separating lines 20, for example by means of sawing. In this case, each finished radiation-emitting component 19 comprises exactly one radiation-emitting semiconductor chip 12 and exactly one leadframe 2.

As shown schematically in FIG. 9, side surfaces of the radiation-emitting components 19 are exposed as a result of the sawing along the separating lines. In particular, as a result of the sawing, the solderable metallic coating 10 is removed from the metallic core 11 of the leadframe 2, such that in certain regions 21 the material of the metallic core 11 is exposed at the side surfaces of the radiation-emitting component 19.

The schematic perspective illustrations in FIGS. 10, 11, 12 and 13 show in more specific detail the regions 21 of the exposed metallic core 11 of the leadframe 2 after the singulating.

Figure 14:
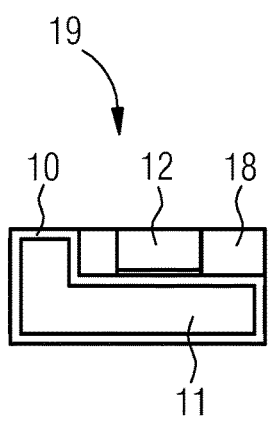
Figure 14:
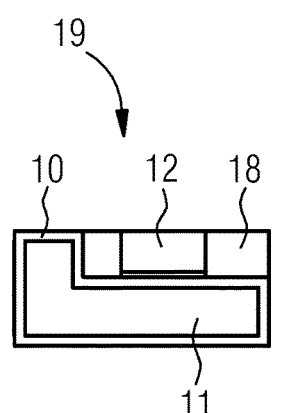
Figure 14:
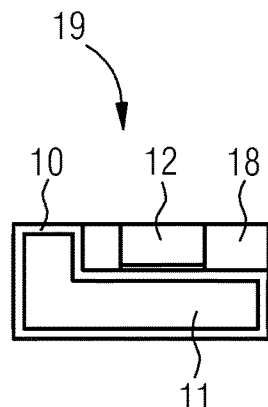
Figure 15:
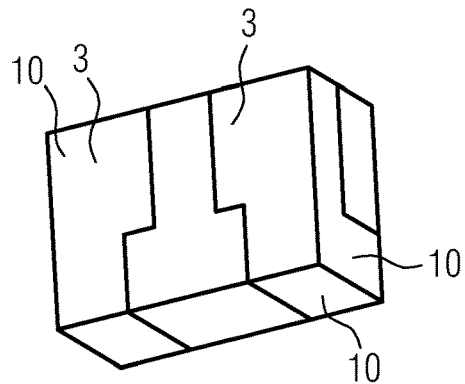
Figure 16:
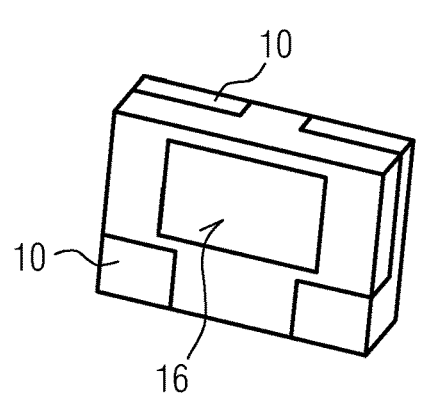
Figure 17:
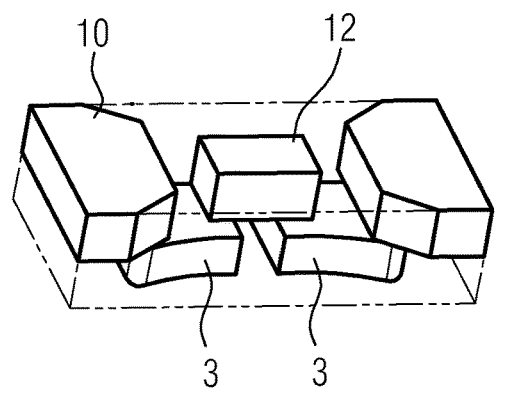
Figure 18:
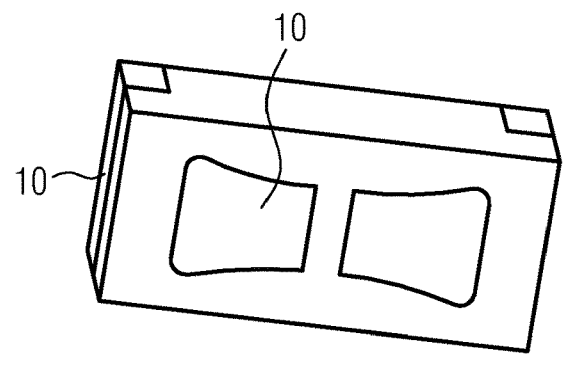

In a next step, the exposed regions 21 of the metallic core 11 of the leadframes 2 are once again provided with the metallic coating 10, for example by means of electrolytic deposition (FIG. 14).

The schematic perspective illustrations in FIGS. 15, 16, 17 and 18 show in more specific detail the regions of the exposed metallic core 11 of the leadframe 2 which are provided with the metallic coating 10. In this case, all exposed regions 21 of the leadframes 2 are formed by the metallic coating 10. Outer surfaces of the radiation-emitting components 19 are formed by the potting 18, the surface of the leadframe 2 and the radiation-emitting main surface 16 of the radiation-emitting semiconductor chip 12.

Figure 19:
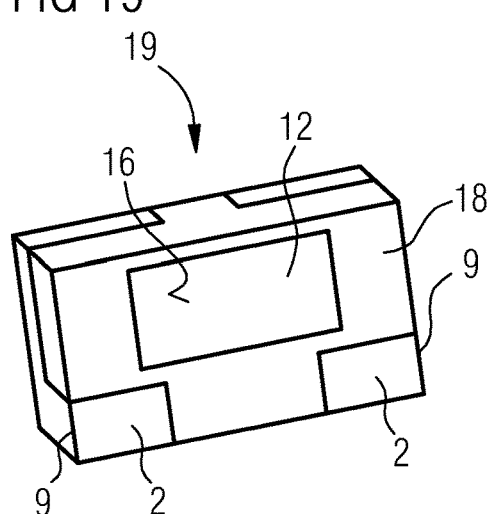
Figure 20:
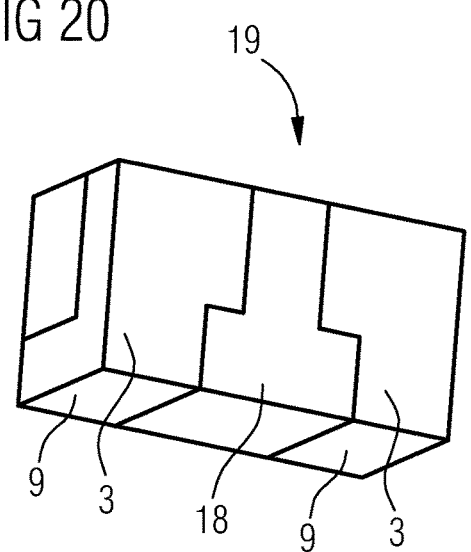

The radiation-emitting component 19 in accordance with the exemplary embodiment in FIGS. 19 and 20 comprises a radiation-emitting semiconductor chip 12, a potting 18 and a leadframe 2. During operation, the radiation-emitting semiconductor chip 12 emits light at least from a radiation-emitting main surface 16. The potting 18 is transmissive to the light which is emitted by the radiation-emitting semiconductor chip 12 during operation. The radiation-emitting main surface 16 of the radiation-emitting semiconductor chip 12 terminates flush with the potting 18 (FIG. 19). The leadframe 2 comprises electrical connection points 3 having mounting surfaces 4, to which the radiation-emitting semiconductor chip 12 is applied (not illustrated). The mounting surfaces 4 are each delimited by a wall 9 that terminates flush with the radiation-emitting main surface 16 of the radiation-emitting semiconductor chip 12. The electrical connection points 3 are freely accessible from outside, such that it is possible to apply the radiation-emitting component 19 to a connection carrier 22 in an electrically conductive manner (FIG. 20).

Figure 21:
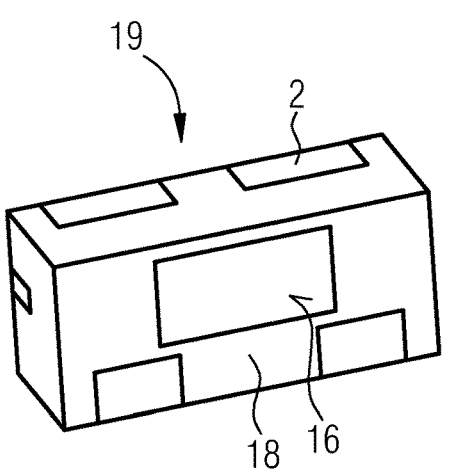
Figure 22:
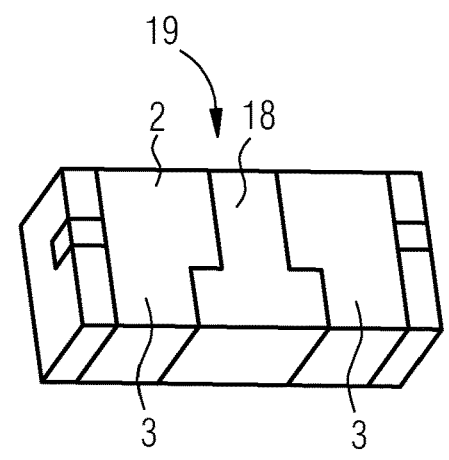
Figure 23:
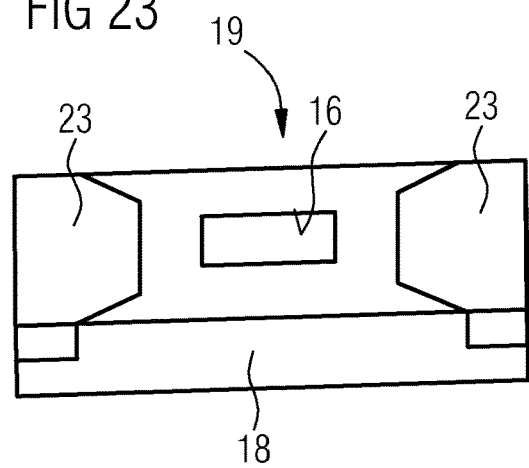
Figure 24:
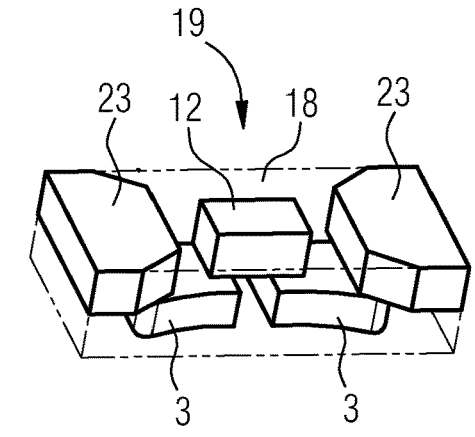

The radiation-emitting component 19 in accordance with the exemplary embodiment in FIGS. 21 and 22 differs from the radiation-emitting component 19 in accordance with the exemplary embodiment in FIGS. 19 and 20 in particular by virtue of the geometry of the leadframe 2 used.

The radiation-emitting component 19 in accordance with the exemplary embodiment in FIGS. 23 to 26 also differs from the already described radiation-emitting components 19 in particular by virtue of the leadframe 2.

The leadframe 2 of the radiation-emitting component 19 in accordance with FIGS. 23 to 26 has, proceeding from a surface of a wall 9 that terminates flush with a radiation-emitting main surface 16 of a radiation-emitting semiconductor chip 12, projections 23 which extend as far as side surfaces of the radiation-emitting component 19 and, like the electrical connection points 3, can serve for external electrical contacting. In this case, the projections 23 run substantially parallel to the electrical connection points 3, but in a different plane. The leadframe 2 is embodied in stepped fashion in sectional view. In this case, the leadframe has a Z-shaped step and an S-shaped step.

Figure 25:
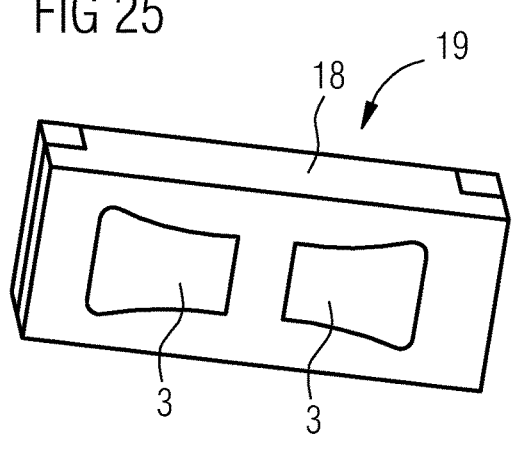
Figure 26:
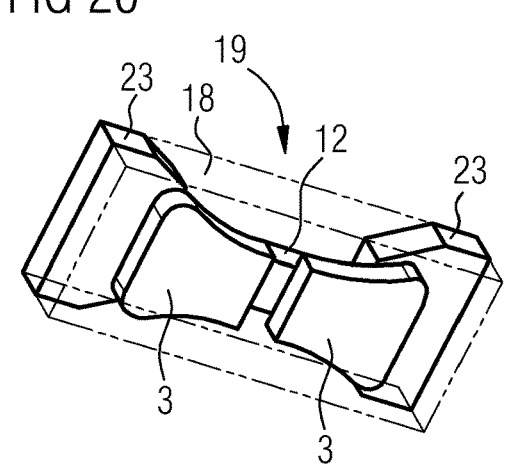
Figure 27:
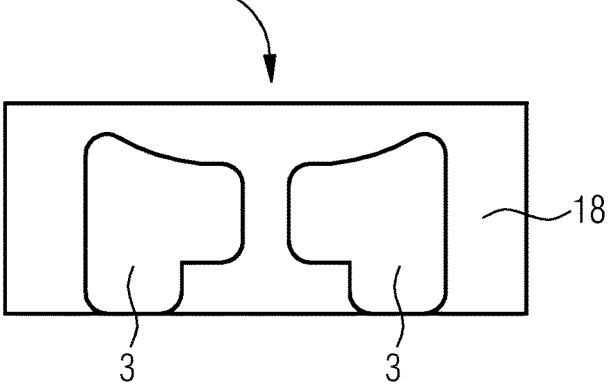

The radiation-emitting component 19 in accordance with the exemplary embodiment in FIG. 27 comprises a leadframe 2 having electrical connection points 3, the geometry of which differs from the geometry of the electrical connection points 3 of the leadframe 2 of the radiation-emitting component 19 in accordance with FIGS. 23 to 26 (cf. in particular FIGS. 25 and 27). In particular, the electrical connection points 3 in accordance with FIG. 27 extend as far as an outer surface of the radiation-emitting component 19.

In the case of the method in accordance with the exemplary embodiment in FIG. 28, firstly the steps such as have already been described with reference to FIGS. 1 to 5 are carried out. In contrast to the method step described with reference to FIG. 6, however, in the case of the present exemplary embodiment, different radiation-emitting semiconductor chips 12 are applied to three directly adjacent leadframes 2. In this case, one of the radiation-emitting semiconductor chips 12 emits blue light, a further semiconductor chip 12 emits green light, and yet another semiconductor chip 12 emits red light. However, radiation-emitting semiconductor chips 12 that emit light of the same color can also be used.

The method in accordance with the present exemplary embodiment differs from the method in accordance with the exemplary embodiment in FIGS. 1 to 18 in particular by virtue of the course of the separating lines 20. In this regard, in the present method, in each case three directly adjacent leadframes 2 are singulated to form a single radiation-emitting component 19.

Figure 28:
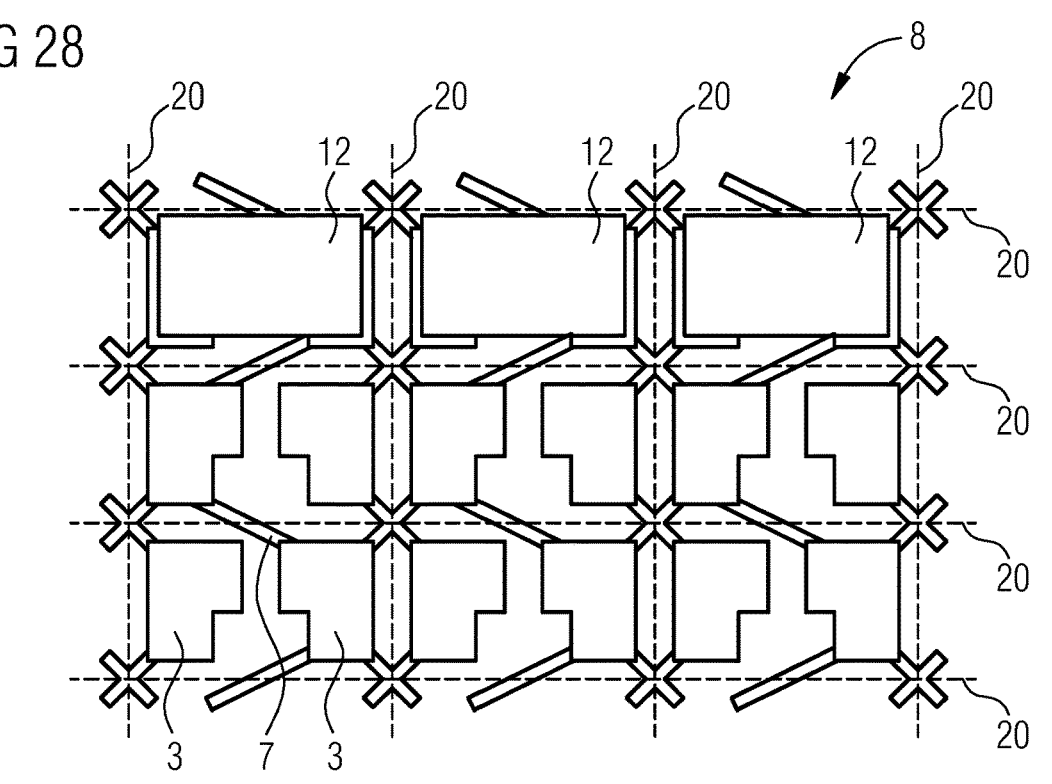
Figure 29:
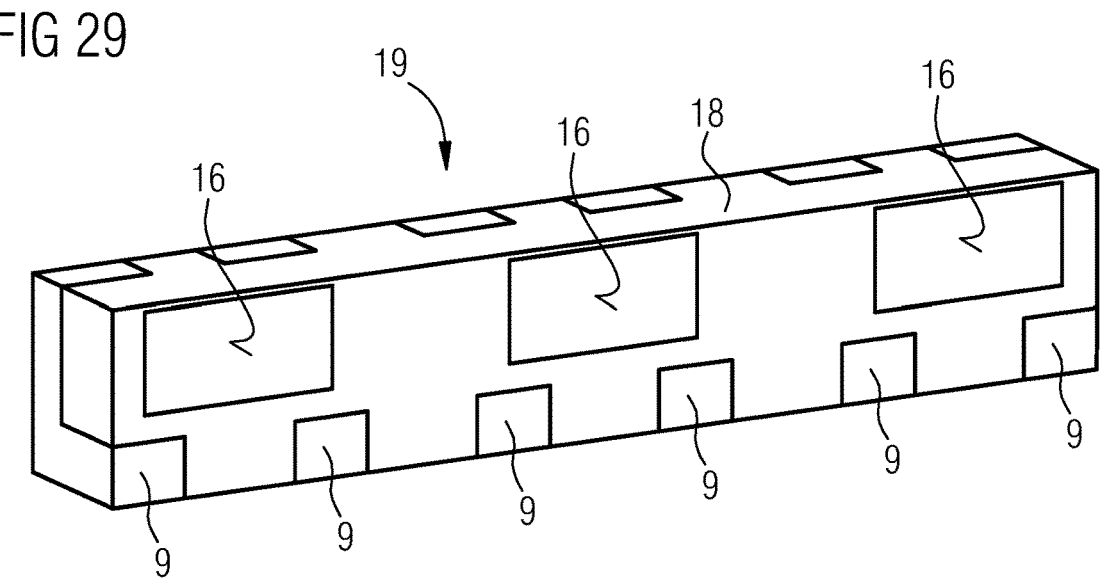
FIGS. 29 and 30 show schematic illustrations of a radiation-emitting component in accordance with one exemplary embodiment.
Figure 30:
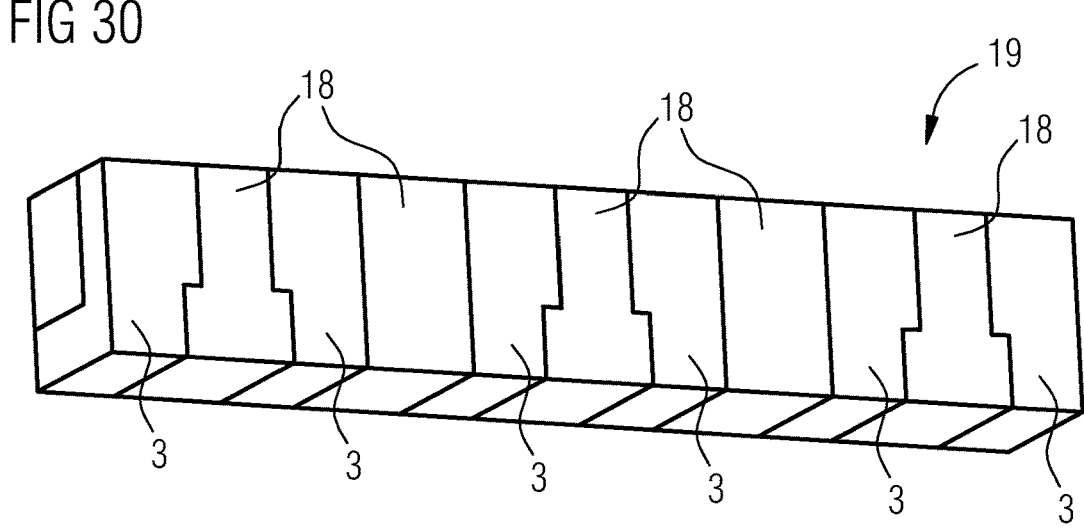

A radiation-emitting component 19 such as can be produced by the method in accordance with FIG. 28 is shown schematically in FIGS. 29 and 30. In contrast to the radiation-emitting components 19 described up until now, the component 19 in accordance with the present exemplary embodiment comprises three radiation-emitting semiconductor chips 12, of which one emits blue light, one emits green light and one emits red light. Each radiation-emitting semiconductor chip 12 has a radiation-emitting main surface 16 that terminates flush with a wall 9 of a leadframe 2 (FIG. 29).

FIG. 30 shows in particular the electrical connection points 3 via which the radiation-emitting component 19 can be applied to a connection carrier 22, for example by means of soldering.

The module 24 in accordance with the exemplary embodiment in FIG. 31 comprises a radiation-emitting component 19 such as has already been described with reference to FIGS. 23 to 26. The radiation-emitting component 19 is applied to a metallic layer 25 of a connection carrier 22 in an electrically conductive manner. In the present case, projections 23 of the leadframe 2 are used for external electrical contacting of the radiation-emitting component 19.

The connection carrier 22 comprises a cutout 26, through which the electromagnetic radiation generated by the radiation-emitting component 19 during operation is emitted. In the case of the present module 24, a radiation exit surface 27 of the component 19 is arranged along a main surface 28 of the connection carrier 22.

Figure 31:
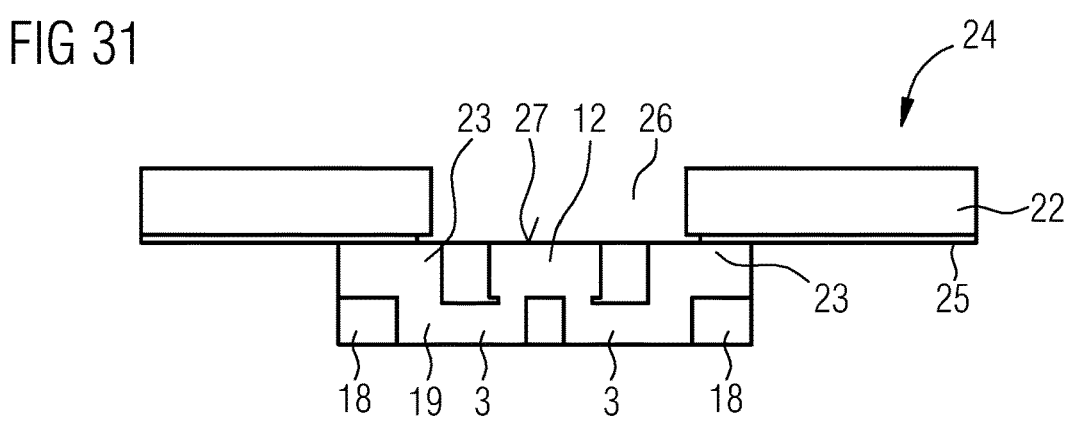
FIGS. 31 to 35 show schematic illustrations of a module in accordance with various exemplary embodiments.
Figure 32:
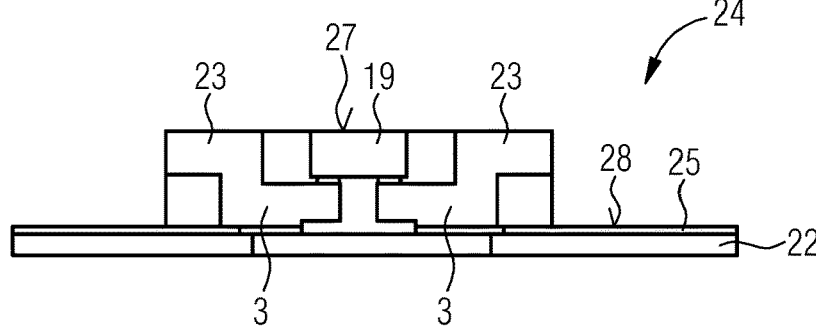

In the case of the module 24 in accordance with the exemplary embodiment in FIG. 32, the radiation-emitting component 19 is likewise applied to a metallic layer 25 of a connection carrier 22 in an electrically conductive and mechanically stable manner. The radiation-emitting component 19 is arranged in such a way that a radiation exit surface 27 of the radiation-emitting component 19 is arranged along a main surface 28 of the connection carrier 22. In contrast to the module 24 in accordance with FIG. 31, however, the radiation-emitting component 19 is applied on the metallic layer 25 by way of the exposed electrical connection points 3, rather than by way of the projections 23 as in the case of the module 24 in accordance with the exemplary embodiment in FIG. 31.

Figure 33:
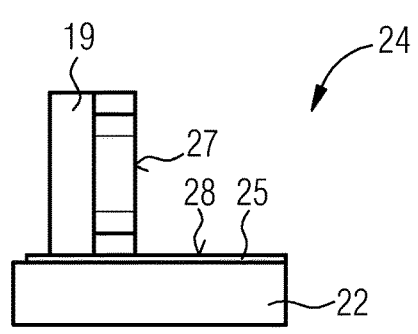

In the case of the module 24 in accordance with the exemplary embodiment in FIG. 33, in contrast to the modules 24 in accordance with the exemplary embodiments in FIGS. 31 and 32, the radiation-emitting component 19 is applied to the connection carrier 22 in an electrically conductive and mechanically stable manner such that a radiation exit surface 27 of the radiation-emitting component 19 runs transversely with respect to a main surface 28 of the connection carrier 22 ("side-looker design"). This is possible in particular since the leadframe 2 of the radiation-emitting component 19 is exposed at some points.

Figure 34:
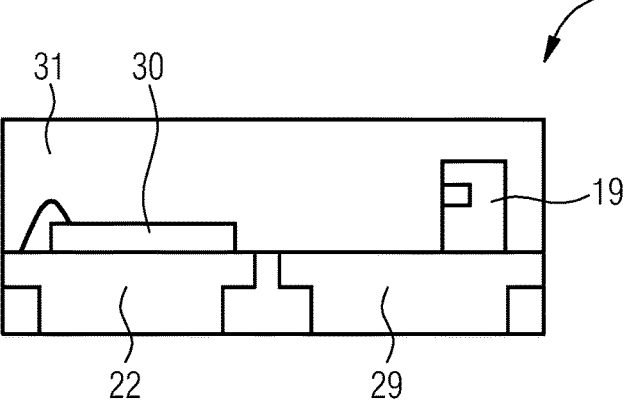

The module 24 in accordance with the exemplary embodiment in FIG. 34 comprises a connection carrier 22 with a QFN submount 29 ("QFN" is an abbreviation standing for "quad flat no leads"). Furthermore, the module 24 comprises a radiation-emitting component 19, which is applied on a connection point of the QFN submount 29 in a side-looker arrangement, as already described with reference to FIG. 33. Furthermore, the module 24 comprises an electronic semiconductor chip 30 having an integrated circuit, said electronic semiconductor chip likewise being arranged on the QFN submount 29. The electronic semiconductor chip 30 and the radiation-emitting component 19 are introduced into a radiation-transmissive potting 31, which is transmissive to the radiation of the radiation-emitting component 19.

Figure 35:
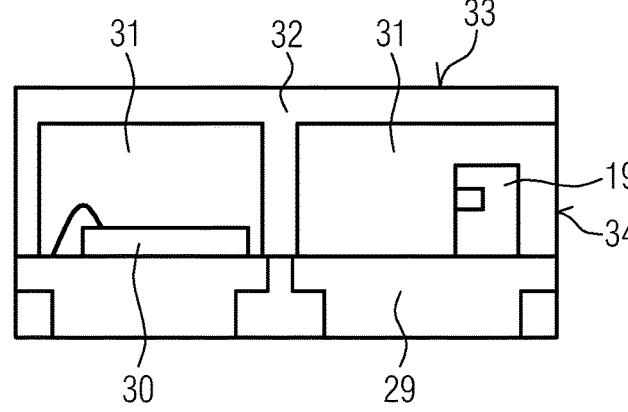

The module 24 in accordance with the exemplary embodiment in FIG. 35, in contrast to the module 24 in accordance with the exemplary embodiment in FIG. 34, additionally comprises a diffusely reflective potting 32, which at some points forms an outer surface 33 of the module 24. A radiation exit surface 34 of the module 24 is exposed. Furthermore, the diffusely reflective potting 32 fills a region between the two connection points of the QFN submount 29. In the present case, the diffusely reflective potting 32 comprises a matrix material, for example silicone, into which diffusely reflective particles are introduced.

The module 24 in accordance with the exemplary embodiment in FIG. 36, in contrast to the module 24 in accordance with the exemplary embodiment in FIG. 35, comprises a radiation-transmissive potting 31 that envelops only the radiation-emitting component 29 and not the electronic semiconductor chip 30. By contrast, the electronic semiconductor chip 30 is surrounded by the diffusely reflective potting 32. The module 24 can be fabricated in a batch process, for example, wherein two radiation-emitting components 19 to be fabricated are each arranged in mirror-inverted fashion with respect to one another and separated by a separating line 20.

In the case of the method in accordance with the exemplary embodiment in FIGS. 37 and 38, as in the case of the method in accordance with FIGS. 1 to 18, firstly a metallic foil 1 is provided (FIG. 37). Then, however, rather than the metallic foil 1 being structured, a wall 9 comprising a highly viscous polymer is applied to the metallic foil 1 (FIG. 38).

In a next step, a radiation-emitting semiconductor chip 12 is applied to a mounting surface 4 (FIG. 39). In this case, a radiation-emitting main surface 16 of the semiconductor chip projects beyond a surface 35 of the wall 9, with the result that a height difference ΔH is formed between the surface 35 of the wall 9 and the radiation-emitting main surface 16.

The radiation-emitting semiconductor chip 12 is then embedded in a potting 18, which compensates for the height difference ΔH (FIG. 40).

The present application claims the priority of the German application DE 102020120502.3, the disclosure content of which is hereby incorporated by reference.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

LIFT OF REFERENCE SIGNS

1 Metallic foil
2 Leadframe
3 Electrical connection point
4 Mounting surface
5 Electrical contact
7 Strut
8 Leadframe assemblage
9 Wall
10 Metallic coating
11 Metallic core
12 Radiation-emitting semiconductor chip
13 Growth substrate
14 Epitaxial semiconductor layer sequence
15 Active zone
16 Radiation-emitting main surface
17 Opposite main surface
18 Potting
19 Radiation-emitting component
20 Separating line
21 Region
22 Connection carrier
23 Projection
24 Module
25 Metallic layer
26 Cutout
27 Radiation exit surface of the component
28 Main surface of the connection carrier
29 QFN submount
30 Electronic semiconductor chip
31 Radiation-transmissive potting
32 Diffusely reflective potting
33 Outer surface

12

34 Radiation exit surface of the module
35 Surface of the wall
ΔH Height difference

The invention claimed is:

1. A radiation-emitting component comprising:
a radiation-emitting semiconductor chip, which during operation emits electromagnetic radiation from a radiation-emitting main surface and has two electrical contacts arranged at a main surface of the radiation-emitting semiconductor chip situated opposite the radiation-emitting main surface,
a leadframe comprising two electrical connection points, each of which has a mounting surface delimited by a wall, wherein the leadframe includes a metallic foil that forms the two electrical connection points, wherein
each electrical contact of the radiation-emitting semiconductor chip is applied to the respective mounting surface, and
the radiation-emitting semiconductor chip projects beyond the wall, and
a potting compensates for the height difference ΔH between a surface of the wall and the radiation-emitting main surface of the radiation-emitting semiconductor chip.

2. The radiation-emitting component as claimed in claim 1, wherein both mounting surfaces are each delimited by a wall, wherein the radiation-emitting semiconductor chip projects beyond each wall.

3. The radiation-emitting component as claimed in claim 1, wherein the radiation-emitting semiconductor chip is embedded in a potting, such that only the radiation-emitting main surface is exposed.

4. The radiation-emitting component as claimed in claim 1, which is free of a premolded package.

5. The radiation-emitting component as claimed in claim 1, wherein outer surfaces of the radiation-emitting component are formed by the potting, the leadframe and the radiation-emitting main surface.

6. The radiation-emitting component as claimed in claim 1, wherein the wall projects beyond the mounting surface.

7. The radiation-emitting component as claimed in claim 1, wherein a sectional view through the wall and the mounting surface is embodied in L-shaped fashion.

8. The radiation-emitting component as claimed in claim 1, wherein the leadframe has, proceeding from a surface of the wall, at least one projection running parallel to an electrical connection point, such that the leadframe is embodied in stepped fashion in sectional view.

9. A module comprising:
a radiation-emitting component as claimed in claim 1, and
a connection carrier, to which the radiation-emitting component is applied.

10. The module as claimed in claim 9,
wherein a radiation exit surface of the radiation-emitting component is arranged along a main surface of the connection carrier.

11. The module as claimed in claim 9, wherein a radiation exit surface of the radiation-emitting component is arranged transversely with respect to a main surface of the connection carrier.

12. The module as claimed in claim 9,
which furthermore comprises an electronic semiconductor chip having an integrated circuit, said electronic semiconductor chip likewise being applied to the connection carrier.

13. The module as claimed in claim 9, wherein an outer surface of the module is partly formed by a diffusely reflective potting, such that only a radiation exit surface of the module is exposed.

14. The module as claimed in claim 9, having a radiation-emitting component comprising:

a semiconductor chip that emits blue light during operation, a further radiation-emitting semiconductor chip, which emits green light during operation, and yet another radiation-emitting semiconductor chip, which emits red light during operation.

15. A method for producing a radiation-emitting component comprising the following steps:

providing a leadframe comprising two electrical connection points, each of which has a mounting surface, wherein the leadframe is produced by means of the following steps:

providing a metallic foil, structuring the metallic foil, thereby forming the electrical connection points having the mounting surfaces, wherein each of the mounting surface is delimited by a wall, applying to the leadframe a radiation-emitting semiconductor chip, which during operation emits electromagnetic radiation from a radiation-emitting main surface and has two electrical contacts arranged at a main surface of the radiation-emitting semiconductor chip situated opposite the radiation-emitting main surface, such that each electrical contact of the radiation-emitting semiconductor chip is applied to a mounting surface, and the radiation-emitting semiconductor chip projects beyond the wall, and providing a potting that compensates for the height difference $\Delta H$ between a surface of the wall and the radiation-emitting main surface of the radiation-emitting semiconductor chip.

16. The method as claimed in claim 15, wherein the structuring is effected by means of one of the following methods: etching, stamping, or embossing.

17. The method as claimed in claim 15, wherein the radiation-emitting semiconductor chip is embedded in a potting in such a way that the radiation-emitting main surface is freely accessible.

18. The method as claimed in claim 17, wherein the radiation-emitting semiconductor chip is embedded in the potting by means of foil assisted molding.

19. The method as claimed in claim 15, wherein the leadframe is part of a leadframe assemblage comprising a multiplicity of leadframes, the leadframe assemblage, after a multiplicity of radiation-emitting semiconductor chips have been applied to mounting surfaces of the leadframes, is singulated into individual radiation-emitting components, wherein material of a metallic core of the leadframes is exposed in regions, and at least the regions in which material of the metallic core is exposed are provided with a metallic coating.

* * * * *